United States Patent

Bosselmann et al.

[11] Patent Number: 5,844,409
[45] Date of Patent: Dec. 1, 1998

[54] METHOD AND SYSTEM FOR MEASURING AN ELECTRIC CURRENT WITH TWO LIGHT SIGNALS PROPAGATING IN OPPOSITE DIRECTIONS, USING THE FARADAY EFFECT

[75] Inventors: Thomas Bosselmann; Peter Menke, both of Erlangen, Germany

[73] Assignee: Siemens Aktiengesellschaft, München, Germany

[21] Appl. No.: 624,440

[22] PCT Filed: Sep. 21, 1994

[86] PCT No.: PCT/DE94/01100

§ 371 Date: Apr. 1, 1996

§ 102(e) Date: Apr. 1, 1996

[87] PCT Pub. No.: WO95/10045

PCT Pub. Date: Apr. 13, 1995

[30] Foreign Application Priority Data

Oct. 1, 1993 [DE] Germany .......................... 43 33 538.1
Jul. 7, 1994 [DE] Germany .......................... 44 23 981.5

[51] Int. Cl.[6] .................................................. G01R 31/00
[52] U.S. Cl. ...................... 324/96; 324/117 R; 324/244.1
[58] Field of Search .............................. 324/96, 750, 751, 324/117 R, 126, 127, 244.1; 250/231.1, 225, 227; 356/368, 367, 365

[56] References Cited

U.S. PATENT DOCUMENTS 4,564,754  1/1986  Sato et al. .................................. 324/96
4,698,497  10/1987  Miller et al. ............................... 324/96
4,973,899  11/1990  Jones et al. ................................ 324/96
5,063,290  11/1991  Kersey .

FOREIGN PATENT DOCUMENTS 0 088 419  6/1986  European Pat. Off. .
0 410 234  1/1991  European Pat. Off. .
92/13280  8/1992  WIPO .

OTHER PUBLICATIONS

J.P. Dupraz, "Fiber–Optic Interferometers for Current Measurement: Principles and Technology", Alsthom Review, N. 9, Dec. 1987, Paris, pp. 29–44.

Primary Examiner—Vinh P. Nguyen
Attorney, Agent, or Firm—Kenyon & Kenyon

[57] ABSTRACT

Method and system for measuring an electric current in a current conductor, two opposing light signals are transmitted through a Faraday element surrounding the current conductor and, after the passage through the Faraday element, are split, respectively, into two partial light signals. From these partial light signals, an intensity-normalized signal is derived for each partial light signal. Provision is made of a Faraday element having a negligible circular birefringence, and a signal processing unit for deriving a vibration-independent and temperature-independent measured signal.

18 Claims, 3 Drawing Sheets

METHOD AND SYSTEM FOR MEASURING AN ELECTRIC CURRENT WITH TWO LIGHT SIGNALS PROPAGATING IN OPPOSITE DIRECTIONS, USING THE FARADAY EFFECT

FIELD OF THE INVENTION

The present invention relates to a method and arrangement for measuring an electric current in a current conductor, in particular with the aid of a Faraday element assigned to the current conductor.

BACKGROUND INFORMATION

Optical measuring arrangements are known for measuring an electric current in a current conductor, using the Faraday effect, which are also designated magneto-optic current transformers. By the Faraday effect is understood the rotation of the plane of polarization of linearly polarized light as a function of a magnetic field. The angle of rotation is proportional to the path integral over the magnetic field along the path traced by the light with the so-called Verdet constant as the constant of proportionality. The Verdet constant is generally dependent on material, temperature and wavelength. To measure the current, a Faraday element made of an optically transparent material such as, for example, glass is arranged in the vicinity of the current conductor. The magnetic field generated by the current effects a rotation of the plane of polarization of linearly polarized light transmitted through the Faraday element by an angle of rotation which can be evaluated as a measured signal. Generally, the Faraday element surrounds the current conductor, so that the measuring light circulates around the current conductor in a closed path. The amount of the angle of rotation is in this case to a good approximation directly proportional to the amplitude of the current to be measured.

The Faraday element can be designed as a solid glass ring around the current conductor as described in European Patent Application No. 0 088 419, or can also surround the current conductor in the form of a measuring winding made of a light-conducting monomode fiber (fiber coil).

Advantages of the magneto-optic current transformer with respect to conventional inductive current transformers are its galvanic isolation and insensitivity with respect to electromagnetic disturbances. However, in the use of magneto-optic current transformers, problems are presented by their temperature and vibration sensitivity.

The Internation Patent Application No. 92/13280 discloses one embodiment of a magneto-optic current transformer having an optical fiber designed as a Faraday measuring winding around the current conductor. In this known embodiment, by the provision of an optical fiber with a high intrinsic circular birefringence ρ0, compared with the Faraday rotation, in conjunction with suitably selected signal processing, vibration influences are largely compensated. The measuring principle in this known embodiment consists in transmitting into the fiber coil two linearly polarized light signals S and T propagating in opposite directions. Both light signals S and T, after the passage through the Faraday element, are split into two partial light signals S1 and S2 or T1 and T2 with planes of polarization orthogonal to each other, and these partial light signals S1 and S2 or T1 and T2 are converted into corresponding electric intensity signals IS1 and IS2 or IT1 and IT2 with the aid of photodetectors. These four intensity signals IS1 and IS2 and IT1 and IT2 are divided by squares of the amplitudes, which correspond to the total intensity IS1+IS2 or IT1+IT2, and are thus intensity-normalized. A measured signal M is derived from the four intensity-normalized signals is1 and is2, or it1 and it2, which is equal to M=((is1−is2)−(it1−it2))/((is1−is2)+(it1−it2)). Now, the Faraday effect is a non-reciprocal effect, so that the two light signals S and T are rotated in the opposite sense of rotation, through the same Faraday angle ρ. The linear birefringence in the material of the fiber is, on the other hand, a reciprocal effect and, therefore, effects the same modulation of the two light signals S and T. The measured signal M formed with this known method is, to a good approximation, equal to ρ/ρO and thus specifically still contains the information about the Faraday rotation ρ of the two light signals S and T and thus about the measured current, the disturbing linear birefringence effects, especially caused by vibrations of the fiber, are however, practically fully eliminated. Nevertheless, the measured signal M is dependent on the circular birefringence ρO used as a calibration quantity and is thus, because of the dependence of the circular birefringence on the temperature, itself temperature dependant.

It is, therefore, the object of the present invention to specify a method and an arrangement for measuring an electric current, using the Faraday effect, in which both the vibration sensitivity and also the temperature sensitivity are largely suppressed.

SUMMARY OF THE INVENTION

The present invention utilizes a method and a system where by using a Faraday element having a circular birefringence which is smaller in comparison to an obtained measured angle using the Faraday effect (with the Faraday rotation), and suitable signal processing means, a measured signal can be obtained which is largely independent both of vibrations and also of the temperature.

DETAILED DESCRIPTION

Figure 1:
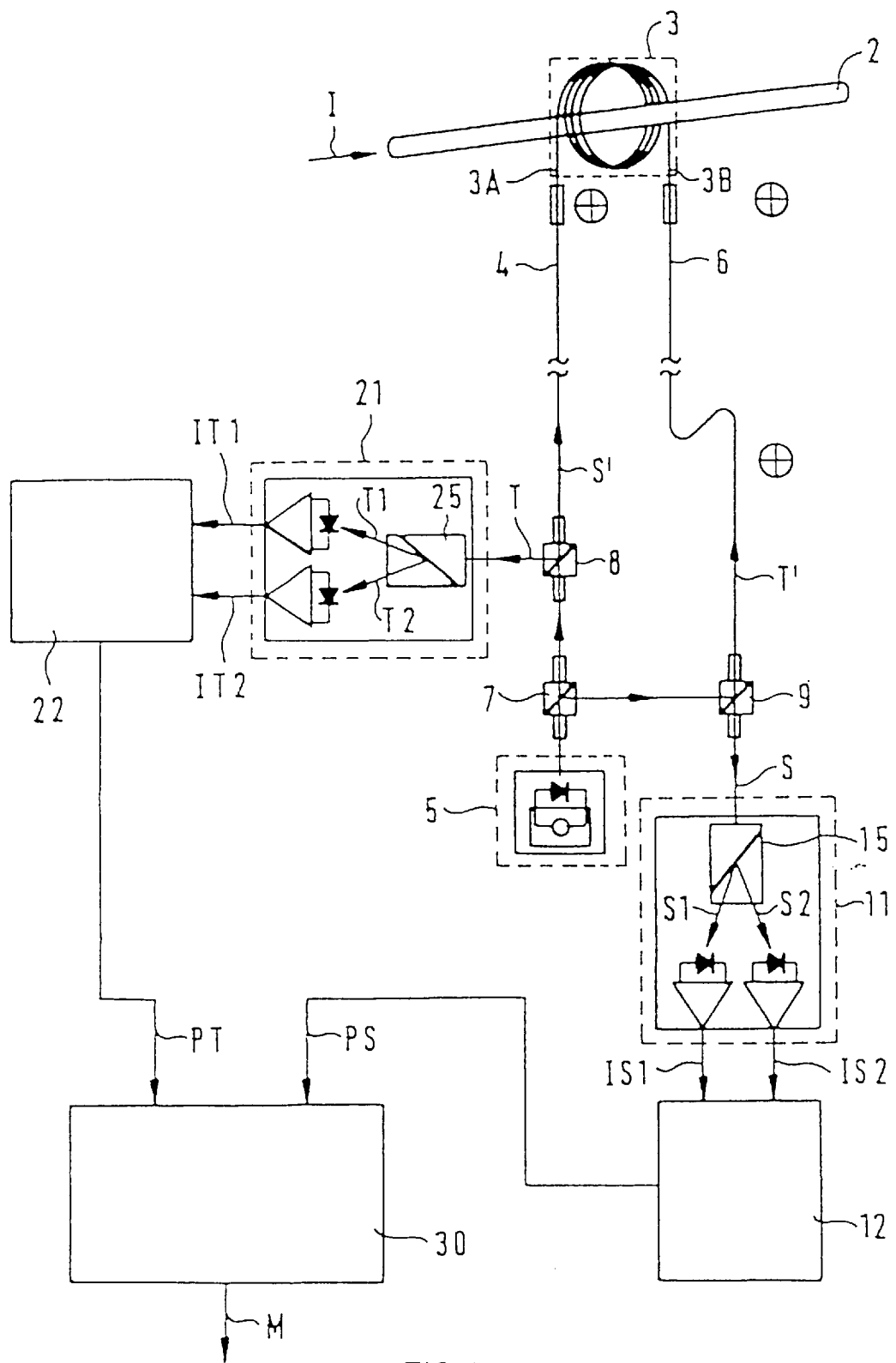
FIG. 1 schematically illustrates an arrangement for measuring an electric current, according to a first embodiment of the present invention.

In FIG. 1, a current conductor is designated with 2, a Faraday element with 3, two optical waveguides as transmission paths with 4 and 6, a linearly polarized light source with 5, three beam splitters as light-splitting means with 7, 8 and 9, two converter units with 11 and 21, two analyzers with 15 and 25, two normalization units with 12 and 22, and a signal processing unit with 30.

Linearly polarized light from the light source 5 is split in the beam-splitter 7 into two correspondingly polarized light signals S' and T', the first light signal S' being let through and the second light signal T' being deflected. The first light signal S' passes through the next beam splitter 8 and is transmitted via the optical waveguide 4 into a first connection 3A of the Faraday element 3 surrounding the current conductor 2 in the form of a measuring winding. The second light signal T' is deflected once more in the beam splitter 9 and transmitted via the optical waveguide 6 to a second connection 3B of the Faraday element 3. The two optical waveguides 4 and 6 are designed for this purpose as preferably polarization-maintaining, and can be monomode fibers, such as, for example, HiBi fibers or polarization-neutral LoBi fibers. Splices, not designated in more detail, can be assigned to the connections 3A and 3B of the Faraday element 3 as detachable connections with the optical waveguides 4 and 6. The optical waveguides 4 and 6 and the Faraday element 3 can also be formed by means of a single, continuous optical waveguide. Furthermore, apart from a fiber coil, a solid glass ring can be provided as Faraday element. The Faraday element 3 can also be constituted of several single glass bodies, which preferably form a light path around the current conductor 2. Finally, the Faraday element does not have to surround the current conductor completely, but can also be arranged beside the current conductor.

Now, the Faraday element 3 is so designed that it exhibits practically no circular birefringence in comparison to the Faraday effect. All common solid glass bodies, especially glass rings, or tempered optical fibers (annealed fiber) are examples of such a design of Faraday element 3.

The two light signals S' and T' propagate through the Faraday element 3 in opposite directions of rotation and are coupled out to the respective opposite connections 3B and 3A as light signals now designated with S and T. During this rotation, the planes of polarization of the two light signals S' and T' are rotated in opposite directions through the Faraday measuring angles $\rho$ and $-\rho$, of approximately equal amount, by the magnetic field generated by a current I in the current conductor 2, and experience at the same time the same modulation by the linear birefringence in the Faraday element 3. By means of the choice of the Faraday element 3, influences on the state of polarization of the two light signals S' and T' by circular birefringence are practically not present. The light signals S and T, rotated through the measuring angle $\rho$ and $-\rho$ in their planes of polarization are now transmitted via the optical waveguides 6 and 4 to the beam splitters 9 and 8. The light signal S is allowed to pass through the beam splitter 9 and is fed to the converter unit 11. The light signal T is deflected in the beam splitter 8 and fed to the converter unit 21. Thus, each of the two light signals S' and S or T' and T respectively pass through each of the two beam splitters 8 and 9 once, so that the intensity losses lost in the beam splitters 8 and 9 are at least approximately equal for both light signals S and T.

The light source 5 and the beam splitters 7, 8 and 9, together with the optical waveguides 4 and 6 or—alternatively—corresponding free-beam transmission paths, form means for transmitting two linearly polarized light signals S' and T' propagating in opposite directions, through the Faraday element 3, the planes of polarization of these two light signals, after the passage through the Faraday element 3, are respectively rotated in the opposite sense of rotation through a measuring angle $\rho$ and $-\rho$.

In each converter unit 11 and 21, the corresponding light signal S or T is split, with the aid of the respective analyzer 15 or 25, into two partial light signals S1 and S2 or T1 and T2 with planes of polarization differing from each other. Preferably, these two planes of polarization are directed at least approximately perpendicular to each other. Polarizing beam splitters such as, for example, Wollaston prisms or two polarization filters crossed at a corresponding angle and a beam splitter can be provided as analyzers 15 and 25. In photoelectric converters not designated in more detail, such as photodiodes connected in amplifier circuits, the partial light signals S1 and S2 and T1 and T2 are converted into corresponding electric intensity signals IS1 and IS2 or IT1 and IT2. The transmission of the partial light signals S1 and S2 and T1 and T2 from the analyzers 15 or 25 to the photoelectric converters can be carried out via a free-beam arrangement or corresponding optical waveguides. The converter units 11 and 21 together form means for splitting each of the two light signals S and T, after passage through the Faraday element 3, into two partial light signals S1 and S2 or T1 and T2 with different planes of polarization and for converting these partial light signals S1, S2, T1 and T2 into corresponding electric intensity signals IS1 and IS2 or IT1 and IT2, which are a measure of the intensity of the corresponding partial light signal.

The intensity signals IS1 and IS2 for the first light signal S are fed to the normalization unit 12, and the intensity signals IT1 and IT2 of the second light signal T to the normalization unit 22. In the normalization units 12 and 22, an intensity-normalized signal PS or PT is generated respectively from the intensity signals IS1 and IS2 or IT1 and IT2. These intensity-normalized signals PS and PT are intended to be formed in such a way that they are independent of intensity fluctuations in the two light signals S and T and their partial light signals S1 and S2 or T1 and T2, which can be caused, for example, by attenuation losses in the transmission paths or fluctuations of the light source 4.

Preferably, the intensity-normalized signals PS and T are formed by means of division of the difference by the sum of the associated two intensity signals IS1 and IS2 or IT1 and IT2, that is to say $$PS=(IS1-IS2)/(IS1+IS2) \tag{1a}$$

and $$PT=(IT1-IT2)/(IT1+IT2). \tag{1b}$$

For this purpose, provision is preferably made in the normalization units 12 and 22 of a subtraction unit designated SUB1 or SUB2 for forming the difference signal IS1–IS2 or IT1–IT2, an adder designated with ADD1 or ADD2 for forming the sum signal IS1+IS2 or IT1+IT2 and a divider designated with DIV1 or DIV2 for forming the quotient signal (IS1–IS2)/(IS1+IS2) or (IT1–IT2)/(IT1+IT2) from the difference signal and the sum signal.

The two intensity-normalized signals PS and PT are fed to the signal processing unit 30. The signal processing unit 30 derives, from the intensity-normalized signals PS and PT, a measured signal M for the electric current I in the current conductor 2 which is both vibration-compensated and temperature-compensated. The temperature compensation is in this case distinctly better than in the arrangement disclosed, for example in WO 92/13280, because of the negligible circular birefringence in the Faraday element 3.

In a first embodiment, not shown, of the present invention the measured signal M is derived from the intensity-normalized signals PS and PT as follows. Firstly, two signals PA=PS+PT and PB=PS−PT are formed. The first signal PA so formed is essentially a function only of the linear birefringence but not of the Faraday angle of rotation $\rho$. The second signal PB, however, is essentially a function only of the Faraday rotation $\rho$. The measured signal M can then be represented approximately as a product of a function f(PA) of the first signal PA with the second signal PB, that is to say $$M=f(PA) \cdot PB.$$

The measured signal M is then determined from the signals PA and PB, preferably by comparison with a previously determined value table (look-up table) of stored calibrated values. The value table can be calculated numerically or determined experimentally. The function f(PA) can be approximated by a linear or quadratic fit function, in order to reduce the number of required calibration measurements. The two intensity-normalized signals PS and PT themselves can, of course, also be used directly, with a corresponding value table, for deriving the measured signal M.

In order to achieve a higher accuracy, the measured signal can also be determined as a general function M=f(PA, PB) of the two signals PA and PB, preferably again with the aid of a value table or a calibrating function. The value table or the calibrating function can be determined experimentally or at least partly by means of fit functions. Linear or quadratic fit functions, for example, can be used as approximations of the temperature-dependance of the normalized signals PS and PT or for function f(PA) which contains the information which contains the information about the temperature.

In the particularly advantageous embodiment of the present invention in which the intensity-normalized signals PS and PT are formed by means of division of the difference by the sum of the associated two intensity signals IS1 and IS2 or IT1 and IT2, according to equations (1a) and (1b), the quotient of two linear functions of the two intensity-normalized signals PS and PT as variables is preferably used as the measured signal M. The measured signal M can then be obtained particularly by means of the relationship $$M=(a*PS-b*PT)/(c*PS+d*PT+e*E) \quad (2)$$

with real coefficients a, b, c, d and e and a unity signal E. The unity signal E, in this case, corresponds in its absolute value to the intensity-normalized signal PS or PT when exactly one of the two intensity signals IS1 or IS2 or IT1 or IT2 disappears.

Figure 2:
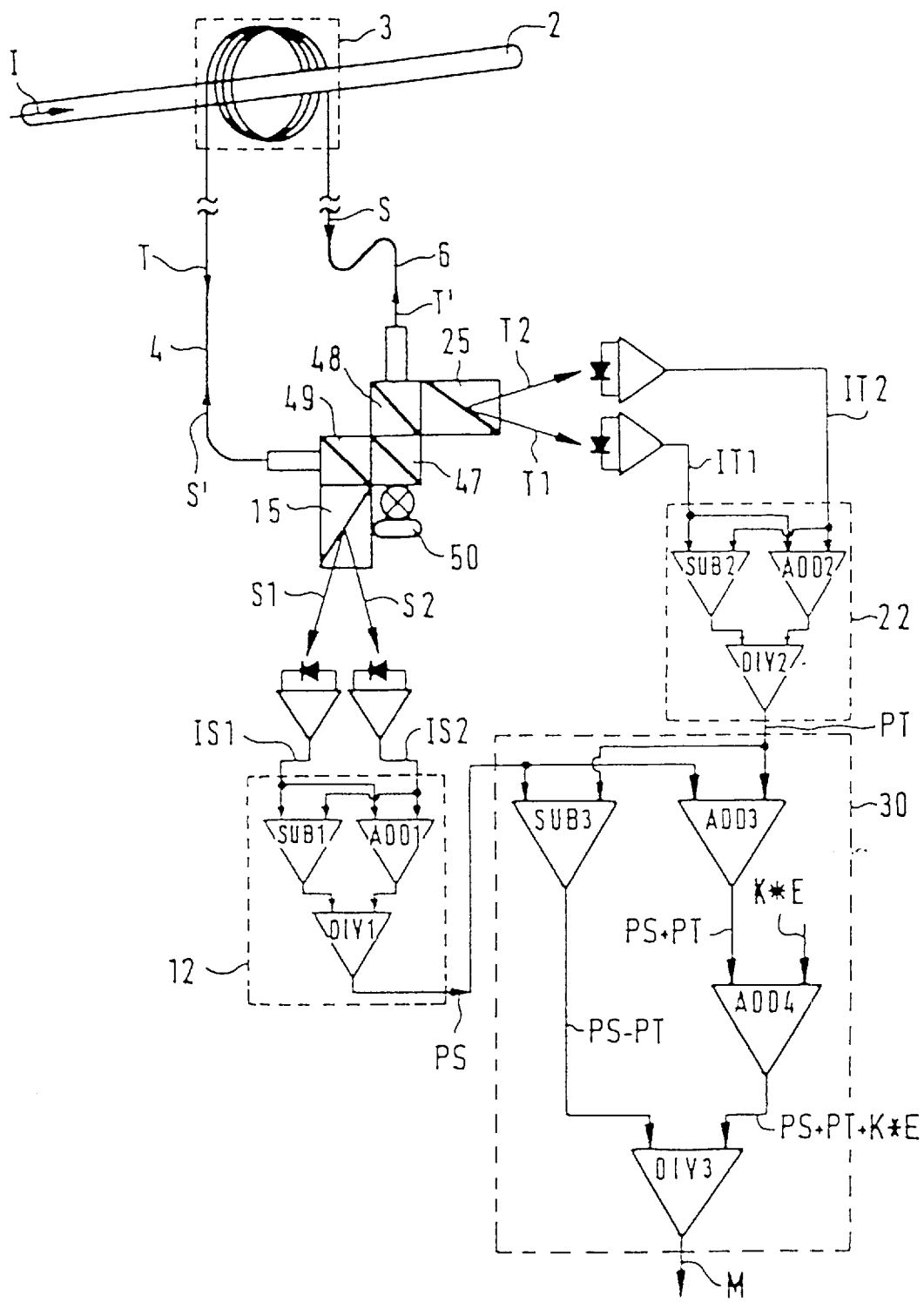
FIG. 2 schematically illustrates a second embodiment of an arrangement for measuring an electric current with particular signal evaluation according to the present invention.

In another embodiment of the present invention, as shown in FIG. 2, the measured signal M is derived from the two intensity-normalized signals PS and PT, by forming the quotient of the difference PS−PT and the sum PS+PT+K'·E, that is to say $$M=(PS-PT)/(PS+PT+K'\cdot E) \quad (3).$$

K' is, in this case, a predetermined, first real correction factor. E is a unity signal which corresponds to the absolute value of the corresponding intensity-normalized signal PS or PT when one of the two associated intensity signals IS1 or IS2 or IT1 or IT2 disappears. In this case, the output levels of the two dividers DIV1 and DIV2 of the two normalization units 12 and 22 are correspondingly mutually matched, in order to obtain the same unity signal E at the output of both dividers DIV1 and DIV2. This measured signal M according to equation (3) is yielded by the general relationship (2), by selecting a=b=1 and c=d=1 and e=K'.

For deriving this measured signal M according to equation (3), provision is preferably made in the signal processing unit 30 of a substraction unit SUB3 for deriving the difference signal PS−PT; a first adder ADD3 for forming the sum signal PS+PT, a second adder ADD4 for forming the sum signal PS+PT+K'*E from the sum signal PS+PT of the first adder ADD1 and of the K'-fold unity signal K'*E and a divider DIV3 for forming the quotient signal (PS−PT)/(PS+PT+K'*E) from the difference signal PS−PT from the substraction unit SUB3 and the sum signal PS+PT+K'*E from the second adder ADD4 as the measured signal M.

By setting the correction factor K', the temperature-dependence of the measured signal M can be eliminated, at least approximately. In general, the correction factor K' lies in a range between −3 and 3.

In an embodiment of the present invention, the correction factor K' and the input coupling angle η between one intrinsic axis of the linear birefringence of the Faraday element 3 and the plane of polarization of each light signal S' and T' coupled into the Faraday element 3, as well as the so-called output coupling angle θ between this intrinsic axis of the linear birefringence and an intrinsic axis of the analyzer 15 or 25 are set in such a way that they fulfil, at least approximately, the following relationships:

$$\sin (2\theta-2\eta)=1 \quad (4a)$$

and $$\cos (2\theta+2\eta)=-K'/3. \quad (4b).$$

The intrinsic axis of a birefringent material is determined by the direction of polarization in which linearly polarized light coupled into the material leaves the material again, unchanged with respect to its polarization.

Possible angular values for solving these equations (4a) and (4b) are, for example, η=10.45° and θ=55.45° for K'=2. Deviations from the angular values fulfilling exactly the above-mentioned relationships (4a) and (4b) are possible, especially in the case of large linear birefringence in the Faraday element 3, and can amount to approximately 5°.

Computations yielded the result that, in the case of angles θ and η chosen in this way as a function of the correction factor K', the measured signal is $$M \cong (2/K')*\sin (2\rho) \quad (5)$$

and thus corresponds, to a good approximation, to its value sin(2ρ) expected from the theory, without birefringence components, scaled by 2/K'.

Figure 3:
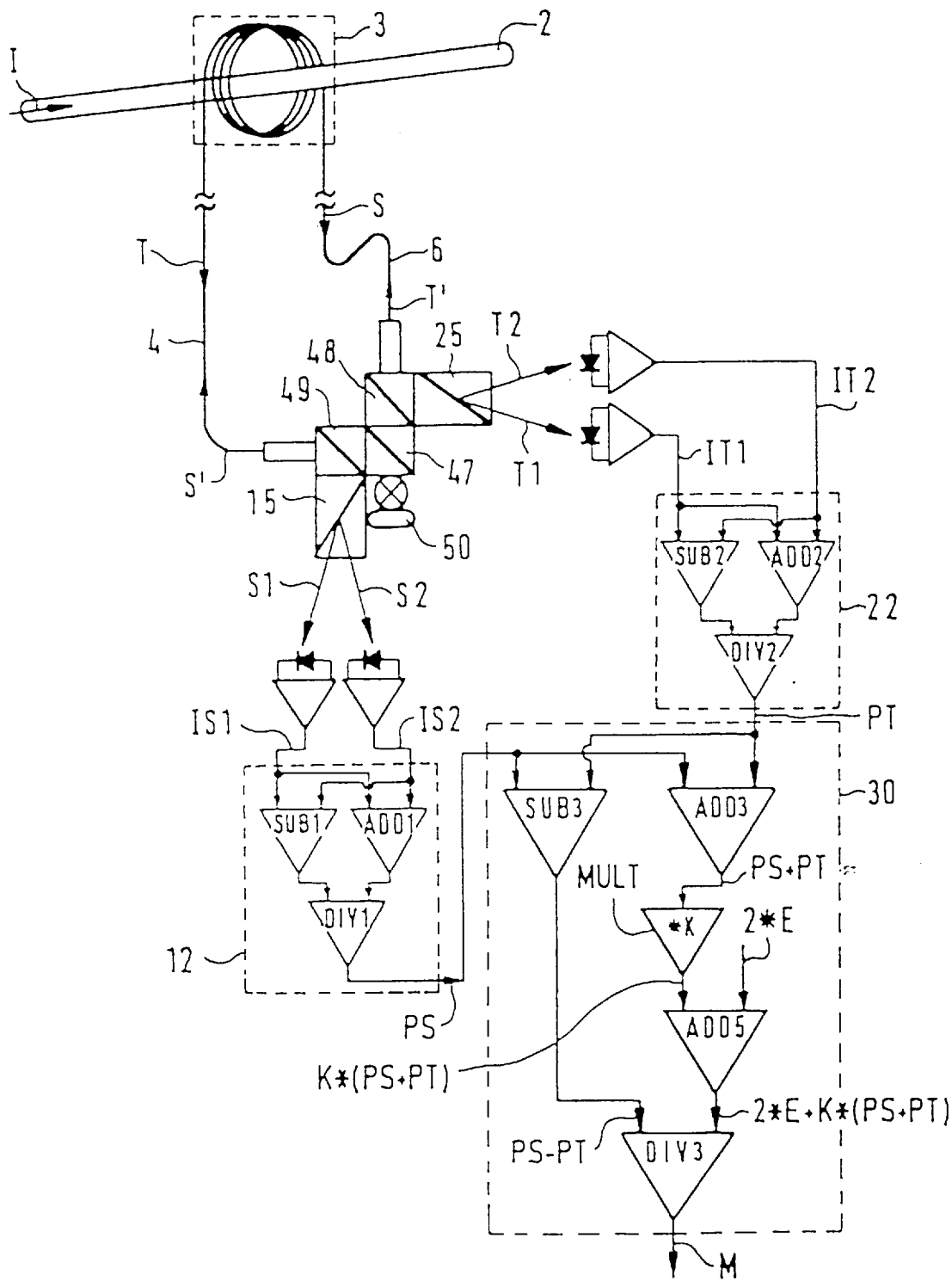
FIG. 3 schematically illustrates a third embodiment according to the present invention.

Another embodiment of the measuring arrangement according to the present invention is shown in FIG. 3. Just as in the embodiment shown in FIG. 2, in the embodiment as shown in FIG. 3, the intensity normalized signals PS and PT are first formed in the normalization units 12 and 22 according to the equations (1a) and (1b) as quotient signals from the differences and the sums of the associated intensity signals IS1 and IS2 or IT1 and IT2. For this purpose, provision is again preferably made in each case of a subtraction unit SUB1 or SUB2, an adder ADD1 or ADD2 and a divider DIV1 or DIV2 in the normalization units 12 or 22.

In the signal processing unit 30, the difference signal PS−PT is once again formed with the aid of the subtraction unit SUB3, and the sum signal PS+PT with the aid of the adder ADD3, from the two intensity-normalized signals PS and PT. The sum signal PS+PT present at the output of the adder ADD3 is then fed to an input of a multiplier MULT. In the multiplier MULT, the input signal is multiplied with a predetermined, second real correction factor K. An amplifier whose gain is set to the correction value K can be provided as multiplier MULT. The sum signal K*(PS+PT), multiplied with the correction factor K and available at the output of the multiplier MULT is now fed to one input of an adder ADD5 and added by the adder ADD5 to a unity signal 2*E multiplied with the factor 2. The unity signal E corresponds in this case in its absolute value to the intensity-normalized signal PS or PT when one of the two intensity signals IS1 or IS2 or IT1 or IT2 disappears. The output of the subtraction unit SUB3 and the output of the adder ADD4 are each connected to a corresponding input of a divider DIV3. From its two input signals PS−PT and 2*E+K*(PS+PT), the divider DIV3 generates the quotient signal (PS−PT)/(2*E+K*(PS+PT) which is used as measured signal M for the electric current I in the current conductor 2.

The signal processing unit 30 therefore forms means for deriving a measured signal M from the two intensity-normalized signals PS and PT, the measured signal M being determined as a quotient signal $$M=(PS-PT)/(K*(PS+PT)+2*E)) \qquad (6).$$

This measured signal M is yielded by the general relationship (2) as a special case, if a=b=1, c=d=K and e=2 are set.

The real correction factor K is preferably set in such a way that the temperature-dependence of the measured signal M is, at least approximately, minimal. In general, the reciprocal value of the correction factor K lies in a range between −1.5 and 1.5.

In an advantageous embodiment of the present invention, the correction factor K is set as a function of the input coupling angle η and of the output coupling θ in such a way that the following two relationships are fulfilled, at least approximately:

$$\sin(2*\theta-2*\eta)=1 \qquad (7a)$$

$$\cos(2*\theta+2*\eta)=-2/(3 \cdot K) \qquad (7b).$$

In this case, the input coupling angle η is again defined as the angle between the plane of polarization of each of the two light signals S' and T' coupled into the Faraday element 3 and an intrinsic axis of the linear birefringence in the Faraday element 3, and the output coupling angle θ is again defined as the angle between this intrinsic axis of the linear birefringence and an intrinsic axis of the analyzer 15 or 25 provided in each case for splitting the light signals S and T into their two respective partial light signals S1 and S2 or T1 and T2.

In the case of the correction factor K, the input coupling angle η and the output coupling angle θ are set in such a way that the measured signal M essentially corresponds to its theoretical value $$M=\sin(2\rho) \qquad (8)$$

without birefringence components and without scaling by a factor depending on the correction factor K. The measuring arrangement in this embodiment can, therefore, be especially simply calibrated for minimum temperature drift by setting the correction factor K in such a way that the measured signal M present at the output of the signal processing unit 30 corresponds to the theoretical signal sin2ρ in the case of linear birefringence not being present. Possible values to fulfil said conditions (7a) and (7b) are, for example, K=1, η=10.45° and θ=55.45°. Deviations from angular values fulfilling the above-mentioned relationships (7a) and (7b) exactly are possible, especially in the case of large linear birefringence in the Faraday element 3, and can amount to approximately 5°.

The means for transmitting the two light signals S' and T', which propagate in opposite directions, through the Faraday element 3 contain, in the embodiments of the present invention shown in FIGS. 2 and 3, miniaturized beam splitters 47, 48 and 49, miniaturized analyzers 15 and 25 and an associated light source 50, as well as collimator lenses (Grin lenses), not designated in more detail, for the optical coupling of the beam splitters 48 and 49 to the associated optical waveguides 6 or 4. The individual components 47, 48, 49, 15 and 25 of these beam-splitter means are preferably bonded to each other and form a compact optical unit. Nevertheless, discrete optical components as in the embodiment shown in to FIG. 1 can also again be provided.

The embodiments of the normalization units 12 and 22 and of the signal processing unit 30 shown in FIGS. 2 and 3 enable compensation for intensity fluctuations and temperature in real time, since they can be realized with analog hardware components. Naturally, however, the measured signal M can also be calculated digitally.

We claim:

1. A method for measuring an electric current in a current conductor, comprising the steps of:

transmitting a first linearly polarized light signal and a second linearly polarized light signal through a Faraday element having a circular birefringence, the first and second linearly polarized light signals propagating in opposite directions and having respective first and second planes of polarization which are rotated through a Faraday measuring angle in opposite rotational directions as a result of transmitting the first and second linearly polarized light signals through the Faraday element, the Faraday measuring angle being dependent on the electric current and being larger than the circular birefringence of the Faraday element;

after the first linearly polarized light signal is transmitted through the Faraday element, splitting the first linearly polarized light signal to generate a first set of linearly polarized partial light signals, and, after the second linearly polarized light signal is transmitted through the Faraday element, splitting the second linearly polarized light signal to generate a second set of linearly polarized partial light signals, each set of linearly polarized partial light signals having different planes of polarization;

converting the first and second sets of linearly polarized partial light signals into corresponding first and second sets of electric intensity signals, the first set of electric intensity signals having an IS1-signal and an IS2-signal, and the second set of electric intensity signals having an IT1-signal and an IT2-signal;

generating a first intensity-normalized signal by dividing the difference of the IS1-signal and the IS2-signal by the sum of the IS1-signal and the IS2-signal, and generating a second intensity-normalized signal by dividing the difference of the IT1-signal and the IT2-signal by the sum of the IT1-signal and the IT2-signal; and generating a vibration-independent temperature-independent measured signal from the first and second intensity-normalized signals.

2. The method according to claim 1, wherein the measured signal is derived as a function of a difference of the first and the second intensity-normalized signals and a sum of the first and second intensity-normalized signals, the difference of the first and the second intensity-normalized signals being dependent on the current and the sum of the first and second intensity-normalized signals being dependent on the linear birefringence of the Faraday element.

3. The method according to claim 2, wherein the measured signal is derived from the first set and second set of intensity-normalized signals using one of a predetermined value table and a calibrating function.

4. The method according to claim 1, wherein the measured signal is generated by dividing the difference of the first and second intensity-normalized signals by a summation value, the summation value being formed by adding the first and second intensity-normalized signals to a unity value, the unity value being generated by multiplying a unity signal by a first correction factor, the unity signal having an absolute value equal to that of the intensity-normalized signal which results when one of the signals of the first or second set of electric intensity signals disappears.

5. The method according to claim 4, wherein the first correction factor is preset to minimize a temperature dependence of the measured signal.

6. The method according to claim 5, wherein the current conductor is associated with an analyzer having an analyzer intrinsic axis for splitting the first and second linearly polarized light signals light into the respective sets of first and second linearly polarized partial light signals, wherein the plane of polarization of each of the first and the second light signals includes an input coupling angle η, the input coupling angle η being formed between one of linear birefringence intrinsic axis and the plane polarization of each of the first and the second light signals, the first correction factor and the input coupling angle η coupled coupling to the Faraday element, and wherein the plane of polarization of each of the first and the second light signals includes an output coupling angle θ formed between the linear birefringence intrinsic axis and the analyzer intrinsic axis, the input and output coupling angles being set according to the following conditions:

sin (2*θ−2*η)=1 cos (2*θ+2*η)=−

(first correction factor)/3.

7. The method according to claim 1, wherein the measured signal is generated by dividing the difference of the first and second intensity-normalized signals by a summation value, the summation value being formed by adding a multiplicative value to a unity value, the multiplicative value being formed by multiplying a predetermined second correction factor by the sum of the first and second intensity-normalized signals, the unity value being formed by multiplying a unity signal by two, the unity signal having an absolute value equal to that of the intensity-normalized signal which results when one of the signals of the first set or second set of electric intensity signals disappears.

8. The method according to claim 7, wherein the second correction factor is preset to minimize a temperature dependence of the measured signal.

9. The method according to claim 8, wherein the current conductor is associated with an analyzer having an analyzer intrinsic axis for splitting the first and second linearly polarized light signals light into the respective sets of first and second linearly polarized partial light signals, wherein the plane of polarization of each of the first and the second light signals includes an input coupling angle η, the input coupling angle η being formed between one of linear birefringence intrinsic axis and the plane polarization of each of the first and the second light signals, the second correction factor and the input coupling angle η coupled coupling to the Faraday element, and wherein the plane of polarization of each of the first and the second light signals includes an output coupling angle θ formed between the linear birefringence intrinsic axis and the analyzer intrinsic axis, the input and output coupling angles being set according to the following conditions:

sin (2*θ−2*η)=1 cos (2*θ+2*η)=−2/(3*second correction factor).

10. The method according to claim 1, wherein the vibration-independent temperature-independent measured signal is generated using, simultaneously, the first and second intensity-normalized signals.

11. A system for measuring an electric current in a current conductor, comprising:

a Faraday element having a circular birefringence;

transmission means for transmitting a first and a second linearly polarized light signal through the Faraday element, the first and second linearly polarized light signals propagating in opposite directions and having a respective first and second planes of polarization which are rotated through a Faraday measuring angle in opposite rotational directions as a result of transmitting the first and second linearly polarized light signals through the Faraday element, the Faraday measuring angle being dependent on the electric current and being larger than the circular birefringence of the Faraday element;

splitting means for splitting the first linearly polarized light signal to generate a first set of linearly polarized partial light signals after the first linearly polarized light signal is transmitted through the Faraday element, and for splitting the second linearly polarized light signal to generate a second set of linearly polarized partial light signals after the second linearly polarized light signal is transmitted through the Faraday element, each set of linearly polarized partial light signals having different planes of polarization;

converting means for forming first and second sets of electric intensity signals from the corresponding first and second sets of linearly polarized partial light signals, the first set of electric intensity signals having an IS1-signal and an IS2-signal, and the second set of electric intensity signal having an IT1-signal and an IT2-signal;

generating means for forming a first intensity-normalized signal by dividing the difference of the IS1-signal and the IS2-signal by the sum of the IS1-signal and the IS2-signal, and for forming the second intensity-normalized signal by dividing the difference of the IT1-signal and the IT2-signal by the sum of the IT1-signal and the IT2-signal; and generating means for generating a vibration-independent temperature-independent measured signal from the first and second intensity-normalized signals.

12. The system according to claim 11, wherein the measured signal is derived as a function of a difference of the first and the second intensity-normalized signals and a sum of the first and second intensity-normalized signals, the difference of the first and the second intensity-normalized signals being dependent on the current and the sum of the first and second intensity-normalized signals being dependent on the linear birefringence of the Faraday element.

13. The system according to claim 11, wherein the measured signal is generated by dividing the difference of the first and second intensity-normalized signals by a summation value, the summation value being formed by adding a multiplicative value to a unity value, the multiplicative value being formed by multiplying a predetermined second correction factor by the sum of the first and second intensity-normalized signals, the unity value being formed by multiplying a unity signal by two, the unity signal having an absolute value equal to that of the intensity-normalized signal which results when one of the signals of the first or second set of electric intensity signals disappears.

14. The system according to claim 13, wherein the second correction factor is preset to minimize a temperature dependence of the measured signal.

15. The system according to claim 14, further comprising an analyzer having an analyzer intrinsic axis for splitting the first and second linearly polarized light signals into the respective sets of first and second linearly polarized partial light signals, wherein the plane of polarization of each of the first and second light signals includes an input coupling angle $\eta$, the input coupling angle $\eta$ being formed between one of a linear birefringence intrinsic axis and the plane polarization of each of the first and the second light signals, the second correction factor and the input coupling angle $\eta$ coupled coupling to the Faraday element, and wherein the plane of polarization of each of the first and the second light signals includes an output coupling angle $\theta$ formed between the linear birefringence intrinsic axis and the analyzer intrinsic axis, the input and output coupling angles being set according to the following conditions:

$\sin(2*\underline{\theta} - 2*\underline{\eta}) = 1$ $\cos(2*\underline{\theta} + 2*\underline{\eta}) = -2/(3*\text{second correction factor})$.

16. The system according to claim 11, wherein the measured signal is generated by dividing the difference of the first and second intensity-normalized signals by a summation value, the summation value being formed by adding the first and second intensity-normalized signals to a unity value, the unity value being generated by multiplying a unity signal by a first correction factor, the unity signal having an absolute value equal to that of the intensity-normalized signal which results when one of the signals of the first or second set of electric intensity signals disappears.

17. The system according to claim 16, further comprising an analyzer having an analyzer intrinsic axis for splitting the first and second linearly polarized light signals light into the respective sets of first and second linearly polarized partial light signals, wherein the plane of polarization of each of the first and second light signals includes an input coupling angle $\eta$, the input coupling angle $\eta$ being formed between one of a linear birefringence intrinsic axis and the plane polarization of each of the first and the second light signals, the first correction factor and the input coupling angle $\eta$ coupled coupling to the Faraday element, and wherein the plane of polarization of each of the first and the second light signals includes an output coupling angle $\theta$ formed between the linear birefringence intrinsic axis and the analyzer intrinsic axis, the input and output coupling angles being set according to the following conditions:

$\sin(2*\underline{\theta} - 2*\underline{\eta}) = 1$ $\cos(2*\underline{\theta} + 2*\underline{\eta}) = -(\text{first correction factor})/3$.

18. The system according to claim 11, wherein the vibration-independent temperature-independent measured signal is generated using, simultaneously, the first and second intensity-normalized signals.

* * * * *